United States Patent [19]

McElfresh et al.

[11] Patent Number: 4,856,001
[45] Date of Patent: Aug. 8, 1989

[54] DIGITAL IN-CIRCUIT TESTER HAVING CHANNEL-MEMORY EARSE-PREVENTER

[75] Inventors: Barbara K. McElfresh, Walnut Creek; Eugene H. Breniman, Antioch, both of Calif.

[73] Assignee: Zehntel, Inc., Walnut Creek, Calif.

[21] Appl. No.: 55,736

[22] Filed: May 29, 1987

[51] Int. Cl.$^4$ .............................................. G01R 31/28
[52] U.S. Cl. .................................. 371/15; 324/73 R; 364/900
[58] Field of Search ........ 364/580, 579, 200 MS File; 364/900 MS File; 324/73 R, 73 AT; 371/20, 15, 16, 27

[56] References Cited

U.S. PATENT DOCUMENTS

| 3,931,506 | 1/1976 | Borrelli et al. | 235/153 AC |
|---|---|---|---|
| 3,943,439 | 3/1976 | Raymond | 324/60 C |
| 4,070,565 | 1/1978 | Borrelli | 364/580 |
| 4,216,539 | 8/1980 | Raymond et al. | 371/20 |
| 4,339,819 | 7/1982 | Jacobson | 371/16 |
| 4,480,315 | 10/1984 | Hickling | 364/900 |
| 4,493,045 | 1/1985 | Hughes, Jr. | 364/580 |
| 4,500,993 | 2/1985 | Jacobson | 371/16 |
| 4,517,661 | 5/1985 | Graf et al. | 364/900 |
| 4,594,544 | 6/1986 | Necoechea | 324/73 AJ |
| 4,604,744 | 8/1986 | Littlebury et al. | 371/20 |
| 4,682,330 | 7/1987 | Millham | 371/20 |
| 4,736,375 | 4/1988 | Tannhäuser et al. | 371/27 |
| 4,763,446 | 10/1987 | Momose | 364/580 |

FOREIGN PATENT DOCUMENTS 0239680 11/1985 Japan ............................. 371/20

Primary Examiner—Parshotam S. Lall
Assistant Examiner—S. A. Melnick
Attorney, Agent, or Firm—Arnold, White & Durkee

[57] ABSTRACT

A digital in-circuit tester has a test-head controller which controls bursts of test vectors generated by a group of driver-receiver channels, the group of driver-receiver channels responsive to an erase instruction from test-head controller. At least one driver-receiver channel is adapted for nullifying the action of an erase instruction. The driver-receiver channel has a first memory for storing information which determines certain actions of the channel during the next burst of test vectors. The memory is responsive to the erase instruction for being erased. The driver-receiver channel also has an erase inhibitor including: an inhibition-state-retention means responsive to an erase-inhibit instruction from the test-head controller for storing an erase-inhibit logic state; and a combinatorial means communicatively coupled to the inhibition-state-retention means, and responsive to the stored erase-inhibit logic state from the inhibition-state-retention means, and responsive to the test-head controller erase instruction for nullifying the action of the erase instruction.

4 Claims, 2 Drawing Sheets

DIGITAL IN-CIRCUIT TESTER HAVING CHANNEL-MEMORY EARSE-PREVENTER

BACKGROUND AND SUMMARY OF THE INVENTION

This invention relates to digital in-circuit testers for testing newly-built printed circuit assemblies. Testers usually have a central processing unit, a testhead controller, one or more driver-receiver cards, and channels. The channels are used to either drive a printed circuit assembly test node or receive a signal from that node, or both drive and receive signals. A small in-circuit tester may be equipped with up to about two hundred channels, and can test small boards. Large digital in-circuit testers with more than three thousand channels also exist. Typical digital in-circuit testers are disclosed in the following patents: U.S. Pat. Nos. 4,339,819 to Jacobsen; 4,216,539 to Raymond et al.; 3,943,439 to Raymond; and 3,931,506 to Borrelli et al. These patents are incorporated herein by reference.

A test-head controller is a complex piece of electronic circuitry which performs many tasks in an in-circuit tester. The test-head controller is often the primary interface between the central processing unit and the rest of the electronic circuits in the tester. In many testers, the test-head controller's list of functions may include control of vacuum valves for fixture actuation, interaction with operator controls and displays, and many other necessary jobs.

An important function of the test-head controller is to control the operation of the driver-receiver cards; that is, assisting them in setting up and executing a burst of test vectors. A "test vector" is a snapshot in time of the state of all the terminals of a device under test ("DUT"). A "burst" is an ordered sequence of vectors intended to conduct a test of the DUT.

Usually the CPU sends information describing a burst to the test head controller, and then the test head controller runs the burst.

The test burst produced by the action of the test head controller is much faster than would be possible were there a small computer organizing the progress of the burst from one vector to the next. Typical computer instruction cycle times are on the order of five hundred to one thousand nanoseconds, and several instructions might be required to get the computer to move from one vector to the next. Thus, the amount of time required to get from one vector to the next in a computer-drive sequence might be more in the neighborhood of five to ten microseconds. A typical test-head controller-based system generates the vectors with special parallel vector-generating hardware capable of delivering a new vector every twenty to five hundred nanoseconds, which is three or more orders of magnitude faster than if a small computer controlled the test vector bursts.

In prior art in-circuit testers, it is common for every terminal of the DUT to be driven and sensed as needed at appropriate occasions during a given test burst.

Commonly in prior-art in-circuit testers, every channel circuit is equipped with a local memory ("RAM"). The memory contains some encoded representation of the sequence of states the channel will go through during the burst. The speed of the memory is often the governing factor in the speed of a test vector burst. If the memory cannot be read but once every one hundred nanoseconds, for example, the driver may not change its state more often than that. Speed is desirable for two reasons. First, devices which pass tests at slow vector burst rates are known to be capable of failing at higher rates. Thus, a faster burst-rate tester is a more effective detector of bad devices. Second, digital in-circuit testers are used in high-production-rate factories, and cannot be allowed to bottleneck vital product flows by consuming time.

Typically, the memories are read out much faster than they are written into. The memories are all read out in parallel during a burst, but the CPU must load them up individually before it can ask the test-head controller to run the burst. Also, prior to the running of the burst, the CPU must execute several instructions for each word of information the CPU transfers to a memory.

Digital in-circuit testers owe their well-known test and diagnostic power to their practice of testing a printed circuit assembly one component at a time. In order to test a single component in a printed circuit assembly, a tester must apply signals directly to its inputs and measure the signals which emanate from its outputs. In particular, and in the idealized case, the tester must pretend that there are no neighboring components generating spurious signals to interfere with the application of the tester's carefully-crafted test vectors. If a neighboring component changes state at an inopportune time, the signal coming from its output may cause noise to superimpose on the signals coming from the tester, and cause an erroneous result.

In-circuit testers attempt to cope with the neighboring-component problem by providing their signals through drivers having very low impedance. Typical in-circuit drivers can drive normal logic voltage levels while sourcing or sinking over four hundred milliamperes. This is called "backdriving" in the test equipment industry. This amount of current is enough to overcome the somewhat higher impedances of the outputs of neighboring components. It is not a complete solution to the problem, however. Some outputs of a printed circuit assembly are actually capable of overcoming a typical in-circuit driver, and other outputs have voluntary signals (e.g. free-running clock oscillators) which cause short-wavelength spikes to leak through the DC backdrive signal.

In any given printed circuit assembly, there is a group of identifiable points which when programmed to the proper state will silence oscillators, and "disable" all data buses. The list is not the same from one printed circuit assembly to another, so it is useful to recognize this property in general and provide for it in the tester's programming system. It is common practice in in-circuit testing to list such points at the beginning of the program in a software construct that will cause the points to be included in every subsequent test burst (programmed to the proper state) whether specifically programmed for that burst or not.

Because the purpose of programming this list of points is to "disable" devices on the DUT which could interfere with the test bursts, the list is commonly referred to as the "disable table". It allows the test programmer to establish a background state in which a DUT is disabled; all subsequent vector bursts in the program will be superimposed on this background state. This saves programming and debugging efforts, by affording the programmer a way to deal with the interference subject just once, and thus not having to acknowledge and work around the problem again on each test of the DUT.

The software system which provides this service of establishing a background state now has an important management job to perform. For each burst, the software must consider whether or not (1) any of the points to be measured are involved in the disable table, and (2) any of the points to be stimulated are involved in the disable table.

Obviously, if a particular test needs to measure a particular output and that output is being backdriven to a steady state because of the disable table entry, the measured signal would not yield a correct response. The tester must remove the entry temporarily from the disable table.

Also, if a particular test needs to stimulate a point which happens to be in the disable table, the disable table must again be temporarily modified so as to apply the desired stimulus rather than the disabling background state. After each burst, the disable table must be returned to its "normal" state.

Clearly, it would be beneficial to decrease the amount of time spent modifying and returning to normal the disable table. Also, it would be beneficial to decrease the amount of time spent loading up the channel memories between bursts of test vectors.

Prior art attempts at this include: increasing the speed of the download hardware, e.g. with direct-memory-access (DMA) hardware in the computer; partitioning the channel memory so that one download can serve for many different bursts; improving the efficiency of the code which describes the vectors to be generated, so that long strings of bits can be regenerated from a small amount of downloaded information; and improving the structure of the memory so that operations such as "erase" which affect multiple cells in the memory can be accomplished in a single event.

The present invention simplifies the CPU's job of modifying the disable table and reloading the channel memories with encoded information for the next burst. Thus, the present invention contributes to the speed of reprogramming between bursts. The present invention protects the contents of the memories of preselected channel circuits associated with the disable table, from being erased whenever the stimulus required for the test sequence is erased.

BRIEF DESCRIPTION OF THE DRAWINGS

The above-noted and other aspects of the present invention will become more apparent from a description of the preferred embodiment when read in conjunction with the accompanying drawings.

The drawings illustrate the preferred embodiment of the invention, wherein like members bear like reference numerals and wherein.

DESCRIPTION OF THE PREFERRED EMBODIMENT

Figure 1:
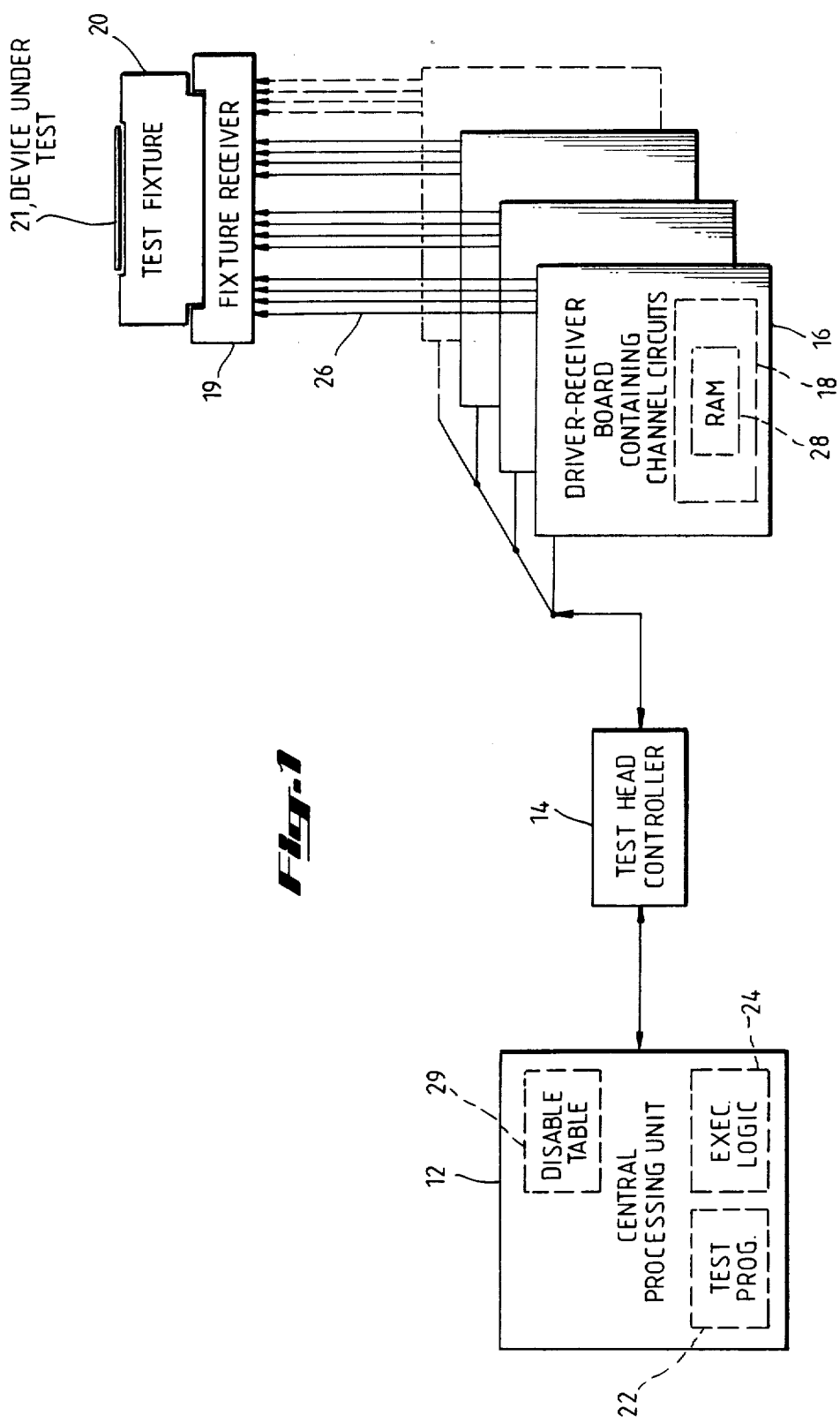
FIG. 1 illustrates a digital in-circuit tester built according to the present invention.

A digital in-circuit tester built according to the present invention is depicted in FIG. 1. The tester contains a central processing unit 12 ("CPU", i.e. a computer), a test-head controller 14, and one or more driver-receiver boards or cards 16 which contain driver-receiver channels, also called channel circuits 18. Some channels 18a only drive a printed circuit assembly being tested with a signal, some channels 18b only receive signals from the printed circuit assembly being tested, while other channels 18c both drive and receive. The test-head controller 14 is concentrated into one module rather than distributed across many driver-receiver boards. This architecture forms an expandable tester. Thus, the test-head controller 14 supports any practical number of driver-receiver channels 18, but in the preferred embodiment supports five-hundred-twelve driver-receiver channels 18, expandable up to two thousand forty-eight channels.

The channels 18 are connected to a fixture receiver 19, which is connected to a test fixture 20, which is connected to a device under test 21 ("DUT"). The driver-receiver channels 18 operating in conjunction with the test-head controller 14 generate a burst of test vectors much faster than the central processing unit 12 alone could do it.

The central processing unit 12 stores as software a test program 22, and an execution logic program 24 for the test program 22. Under control of the test program 22 and the execution logic software 24, the central processing unit 12 sends encoded information to the test-head controller 14 describing a burst of test vectors intended to constitute a test or a part of a test of the DUT 20. The test-head controller 14 stores this information in memories located both in the test-head controller 14 and on the driver-receiver boards 16. Upon a subsequent command from the central processing unit 12, the test-head controller 14 causes the channel circuits 18 to generate a test vector burst at high speed according to the encoded information. Thus, there are two main phases in the process: (1) the central processing unit 12 sends information describing a burst to the test-head controller 14; and (2) the test-head controller 14 runs the burst.

At any given point in a burst, the test vector contains information about each connection between the DUT 21 and the tester. For every signal line 26 of interest, the tester may be "driving" (i.e. providing a logic signal of low impedance) or receiving. If it is driving, it may be driving a "true" or a "false" level. If the tester is receiving, it will expect to see the DUT deliver a "true" signal or a "false" signal. A driver-receiver channel circuit 18 is capable of representing these four separate logical variables (drive or not, true or false; receive or not, true or false), and thus could be in any one of sixteen states on any given vector in the burst, and could be instructed by the test-head controller 14 either to remain in the same state or to change to any of the other fifteen states for the next vector in the burst.

The channel 18 has a local memory 28 ("RAM"). The central processing unit 12 includes a Disable Table 29.

Figure 2:
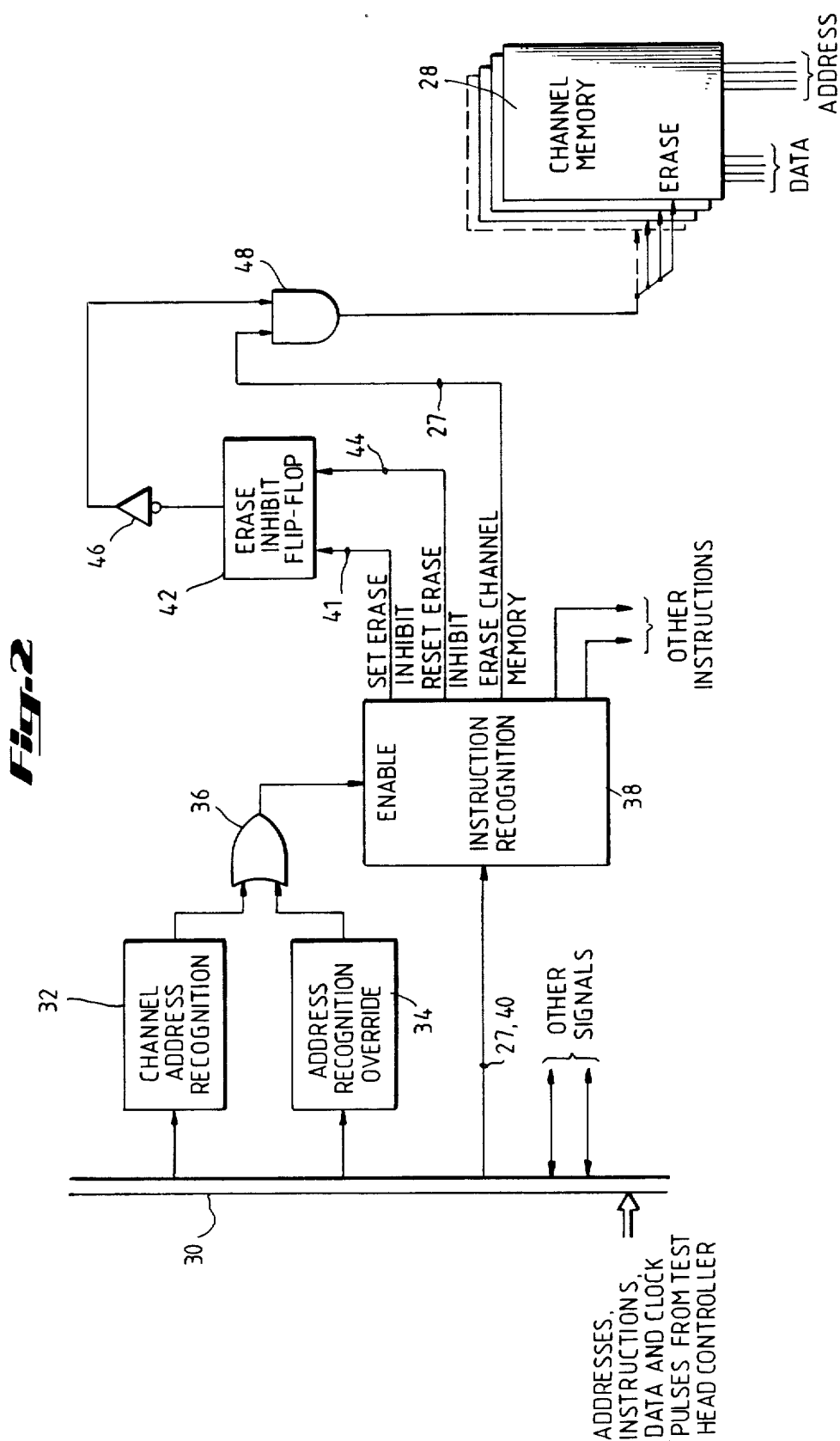
FIG. 2 depicts part of the driver-receiver channel illustrated in FIG. 1.

FIG. 2 depicts the driver-receiver channel 18 built according to the present invention. A collection of signal lines 30 communicate information between the test-head controller 14 and the driver-receiver cards 16. The signal lines 30 are located physically in the backplane of a card cage which holds sixty-four driver-receiver cards 16.

Because there are several driver-receiver cards 16 in each tester, each card 16 must have a unique address. A channel address recognition circuit 32 recognizes when the test-head controller 14 is delivering information specifically for a given card 16. In this way, one driver-receiver card 16 handles the first thirty-two channels 18 and the next driver-receiver card 16 in the cage handles the second thirty-two channels 18, etc.

It is beneficial for the test-head controller 14 to issue instructions to groups of cards 16, e.g. to establish an initial condition, without having to repeat the instruction several times, once at each address. For this purpose, the driver-receiver card 16 also contains an address-recognition-override circuit 34. When the test-head controller 14 needs to give all cards 16 the same instruction, the controller 14 stimulates simultaneously the address-recognition-override circuit 34 on all boards 16.

An OR gate 36 combines the outputs of the address recognition circuit 32 and the override circuit 34 to enable an instruction recognition circuit 38. Thus a driver receiver board 16 can respond to instructions either when the board 16 is addressed individually or when the card 16 is made part of a group of boards through the function of the address-recognition-override circuit 34.

One very useful instruction in a driver-receiver card 16 is an erase channel memory instruction 27 which causes the channel memory 28 to be erased. In testers presently available, the channel memories 28 are erased between bursts, and then programmed up from an initialized state. The program consists of the disable table 29 information plus the encoded information for the new burst. The erase-everything-and-reprogram procedure is used in preference to an incremental reprogramming approach because the former is less complicated and in most cases takes less time. If the channels 18 were to be incrementally reprogrammed between bursts, then the computer 12 would have to determine exactly what the changes were from one burst program to the next and rewrite only the changes.

Also, typical programming practices result in the reprogramming of almost all the non-disable table channels 18. Therefore, fewer cycles are involved, especially since the address-recognition-override circuit 34 provides a global reset function in one operation. Were the channels 18 not provided with an address-recognition-override circuit 34, each channel 18 would have to be erased individually.

In the present invention, the reprogramming speed increases because the disable table 29 is not set up again for each new test. Instead, at the beginning of a long series of separate tests, the disable table 29 information is written into the channels 18 which will participate in the disable table 29 function. Then each of these channels 18 is sent an erase inhibit instruction 40.

Each channel 18 has the structure illustrated in FIG. 2 for controllably inhibiting the effect of the global erase instruction 27. A set erase inhibit instruction 41 sets an erase-inhibit flip-flop 42. The erase-inhibit flip-flop 42 can also be reset by a reset-erase-inhibit instruction 44.

The output of the erase-inhibit flip-flop 42 acts through a NOT gate 46 and an AND gate 48. If the erase-inhibit flip-flop 42 has been set, the memory 28 will not be erased by the erase channel memory instruction 27. If the erase inhibit flip-flop 42 has not been set, the erase channel memory instruction 27 will cause the channel memory 28 to be erased.

Thus the contents of the memories whose channels supply the background state can be preserved while all other memories are erased. This results in a significant saving of time over existing methods for reprogramming channel memories between bursts.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. In a digital in-circuit tester having a test-head controller, connected to a plurality of driver-receiver channels, which controls bursts of test vectors generated by said driver-receiver channels for driving contact elements of a test fixture, the plurality of driver-receiver channels being responsive to an erase instruction from the test-head controller, at least one driver-receiver channel comprising:

(a) a memory communicatively coupled to the test-head controller for storing information which determines certain actions of a respective channel during an upcoming burst of test vectors, the memory being erased responsive to an erase instruction generated by said test-head controller;

(b) an erase inhibitor communicatively coupled to the test-head controller comprising:

(i) an inhibition-state-retention means responsive to an erase-inhibit instruction from the test-head controller for generating an erase-inhibit logic state at an output of said inhibit-state-retention means; and (ii) combinatorial means communicatively coupled to the output of the inhibition-state-retention means and responsive to the generated erase-inhibit logic state and responsive to the test-head controller erase instruction for preventing the erasure of said memory even when said erase instruction is generated by said test-head controller.

2. In a digital in-circuit tester having a test-head controller, connected to a plurality of driver-receiver channels, which controls bursts of test vectors generated by said driver-receiver channels for driving contact elements of a test fixture, the plurality of driver-receiver channels being responsive to an erase instruction from the test-head controller, each of said plurality of driver-receiver channels comprising:

(a) settable and resettable memory flip-flop communicatively coupled to the test-head controller for storing information which determines certain actions of the respective channel during an upcoming burst of test vectors, the memory flip-flop being reset responsive to an erase signal at an erase input thereof;

(b) an erase inhibitor communicatively coupled to the test-head controller comprising:

(i) an erase-inhibit flip-flop being set responsive to an erase-inhibit instruction from the test-head controller or providing an erase-inhibit logic state at an output of said erase-inhibit flip-flop; and (ii) an AND gate, having a first input coupled to receive a complement of said output of said erase-inhibit flip-flop, a second input coupled to receive an erase instruction from said test-head controller, and an output connected to said erase input of said memory flip-flop.

3. In a digital in-circuit tester as recited in claim 2, each said erase-inhibit flip-flop of each of said plurality of driver-receiver channels being reset responsive to a reset-erase-inhibit instruction from the test-head controller for resetting said erase-inhibit logic state at said output of said erase-inhibit flip-flop.

4. In a digital in-circuit tester having a test-head controller which controls bursts of test vectors generated by a group of driver-receiver channels for driving contact elements of a device under test, the group of driver-receiver channels responsive to an erase instruction from the test-head controller, a method for selectively nullifying an erase instruction to a given driver-receiver channel from the test-head controller comprising the steps of:
 (a) determining the presence or absence of an erase-inhibit signal in the given driver-receiver channel;
 (b) sending an erase instruction to erase a memory in each driver-receiver channel of the group of driver-receiver channels;
 (c) erasing said memory in the given driver-receiver channel when said erase instruction is sent in the absence of said erase-inhibit signal; and
 (d) prohibiting erasing said memory in the given driver-receiver channel when said erase instruction is sent in the presence of said erase-inhibit signal.

* * * * *

UNITED STATES PATENT AND TRADEMARK OFFICE
CERTIFICATE OF CORRECTION

PATENT NO. : 4,856,001
DATED : August 8, 1989
INVENTOR(S) : McElfresh, et al.

It is certified that error appears in the above—identified patent and that said Letters Patent is hereby corrected as shown below:

Column 6, line 29, change "inhibit" to --inhibition--.
Column 6, line 47, after "(a)" insert --a--.

Signed and Sealed this

Twenty-fourth Day of July, 1990

Attest:

HARRY F. MANBECK, JR.

*Attesting Officer*   *Commissioner of Patents and Trademarks*